United States Patent [19]
Kadosh et al.

[11] Patent Number: 5,770,483
[45] Date of Patent: Jun. 23, 1998

[54] MULTI-LEVEL TRANSISTOR FABRICATION METHOD WITH HIGH PERFORMANCE DRAIN-TO-GATE CONNECTION

[75] Inventors: Daniel Kadosh, Austin; Mark I. Gardner, Cedar Creek; Fred N. Hause, Austin, all of Tex.

[73] Assignee: Advanced Micro Devices, Inc., Sunnyvale, Calif.

[21] Appl. No.: 729,795

[22] Filed: Oct. 8, 1996

[51] Int. Cl.$^6$ .............................. H01L 21/00; H01L 21/84
[52] U.S. Cl. ........................................... 438/152; 438/238
[58] Field of Search ..................... 438/152, 238

[56] References Cited

U.S. PATENT DOCUMENTS

| | | | |
|---|---|---|---|
| 5,470,776 | 11/1995 | Ryou | 438/152 |
| 5,492,851 | 2/1996 | Ryou | 438/152 |
| 5,610,094 | 3/1997 | Ozaki et al. | 438/152 |

*Primary Examiner*—John Niebling
*Assistant Examiner*—David A. Zarneke
*Attorney, Agent, or Firm*—Kevin L. Daffer; Conley, Rose & Tayon

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds to the overall circuit density but does so with emphasis placed on interconnection between devices on separate levels. Thus, high performance interconnect is introduced whereby the interconnect is made as short as possible between features within one transistor level to features within another transistor level. The interconnect employs a via routed directly between the drain region of an upper level transistor to the gate of a lower level transistor so as to effect a direct coupling between the output of one transistor to the input of another. Direct coupling in this fashion affords a lower propagation delay and therefore achieves the benefit of a higher performance, faster switching circuit.

18 Claims, 4 Drawing Sheets

MULTI-LEVEL TRANSISTOR FABRICATION METHOD WITH HIGH PERFORMANCE DRAIN-TO-GATE CONNECTION

BACKGROUND OF THE INVENTION

1. Field of the Invention

This invention relates to integrated circuit manufacture and more particularly to multi-level transistor fabrication and high performance interconnect arranged therebetween.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite the junction in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0 $\mu$m critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefore be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

Before a multi-level transistor fabrication process can be introduced, however, that process must pay careful attention to the interconnection between the transistors placed on separate levels. Therefore, it is desirable to derive an interconnect scheme which can connect various features on one elevation (topological) level to features on another level. That interconnection must be as short as possible in order to minimize propagation delays between transistors. The desired fabrication process must therefore incorporate not only multi-level fabrication but also high performance interconnect routing as an essential part of the fabrication process. Without a mechanism to achieve high speed interconnection, multi-level fabrication is limited in its application.

SUMMARY OF THE INVENTION

The problems outlined above are in large part solved by a multi-level transistor fabrication technique. The present technique can produce one or more active and passive devices on a first level, followed by one or more active and passive devices on a second level. The first level is substantially planar and extends across an entire wafer surface. The second level is also substantially planar and parallel to the first level, but spaced by a dielectric therefrom.

According to a preferred embodiment, a transistor formed on a first level and a transistor formed on a second level are aligned with one another so that a via can be placed directly between the transistors, i.e., between the two levels substantially perpendicular to those levels. The via extends in a vertical direction directly between a junction of the upper (second level) transistor and the gate conductor of the lower (first level) transistor. Preferably, the junction of the second level transistor is the drain region, whereby the via connects the drain of the second level transistor to the gate of the first level transistor. As such, the via forms a connection between the output of one transistor and the input of another transistor. The via is a high performance via in that it is relatively short, and is routed directly between the respective transistor input and transistor output.

The high performance input/output via connection is achieved by configuring the second level transistor in a specific location relative to the first level transistor. The second level transistor is arranged laterally upon an interlevel dielectric configured between the first and second level transistors. The second level transistor is encompassed within a doped polysilicon. The doped polysilicon thereby consists of the second level transistor substrate or well into which the junctions are implanted. The edge of the polysilicon substrate or well is aligned with the first level transistor such that the edge exists over at least a portion of the first level transistor gate conductor. A via of predefined width extends from the edge of the polysilicon, i.e., at the drain edge, a vertical distance such that it connects with the top of the first level transistor gate conductor. Thus, the via extends along an axis perpendicular to the planes in which the first and second level transistors are placed. That axis is preferably vertical and relatively short as defined by the thickness of the interlevel dielectric. As the drain junction is implanted into the polysilicon, the drain extends to the edge of the polysilicon and to the bottom of the polysilicon such that via connection at the polysilicon edge is achieved.

Broadly speaking, the present invention contemplates a method for interconnecting a gate of a first level transistor (i.e., first transistor) to a drain of a second level transistor (i.e., second transistor). A dielectric is deposited across the first transistor, and specifically across the gate conductor of the first transistor and the topography lateral to the gate conductor. A trench is then formed within the dielectric and thereafter the trench is filled with a polysilicon material. An opening is thereafter etched through the dielectric to the gate conductor. The opening is then filled with a metal, wherein the metal contacts a drain side of the polysilicon. Various dopants are deposited into the drain side of the polysilicon to form a drain region of the second level transistor.

The present invention further contemplates an interconnect formed between a first transistor gate conductor and a second transistor drain. The interconnect comprises a metal via extending along a vertical axis between opposed upper and lower via portions. A bottom surface of the interconnect proximate to the lower portion is configured to abut against a first transistor gate conductor. A lateral surface of the interconnect proximate to the upper portion is configured to abut against a second transistor drain. At least a portion of the second transistor is therefore dielectrically spaced above the first transistor.

Preferably, the first topography upon which the gate conductor of the first transistor is formed comprises a silicon substrate coated with an oxide of relatively uniform thickness. The dielectric formed across the gate conductor of the first transistor and the first topography may comprises oxide or, more specifically, silicon dioxide in relatively stoichiometric proportions. Preferably, the metal used to fill the opening to form the interconnect via is either titanium, tungsten, titanium nitride or aluminum (i.e., Ti, W, TiN or Al), or any combination of these metals.

BRIEF DESCRIPTION OF THE DRAWINGS

Other objects and advantages of the invention will become apparent upon reading the following detailed description and upon reference to the accompanying drawings in which.

Figure 1:
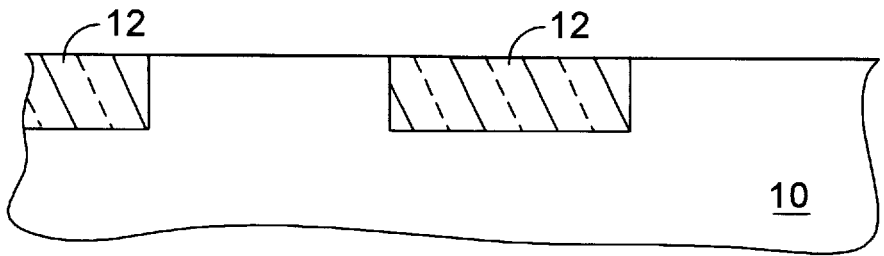
FIG. 1 is a partial cross-sectional view of a semiconductor substrate with isolation regions spaced therein according to an initial processing step of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial cross-sectional view of a semiconductor substrate 10. Substrate 10 is preferably a silicon-based, single crystalline material doped either n-type or p-type. Arranged on the upper surface of substrate 10 are various isolation structures 12. Isolation structures 12 are formed in numerous ways. For example, structures 12 can be formed by etching a trench into the upper surface of substrate 10 and thereafter filling the trench with an oxide, a suitable oxide being a chemical vapor deposited ("CVD") oxide. Alternatively, isolation structure 12 can be a thermally grown oxide. The grown oxide is formed by exposing select regions of substrate 10 surface to an oxidizing ambient according to the well known LOCOS process.

Figure 2:
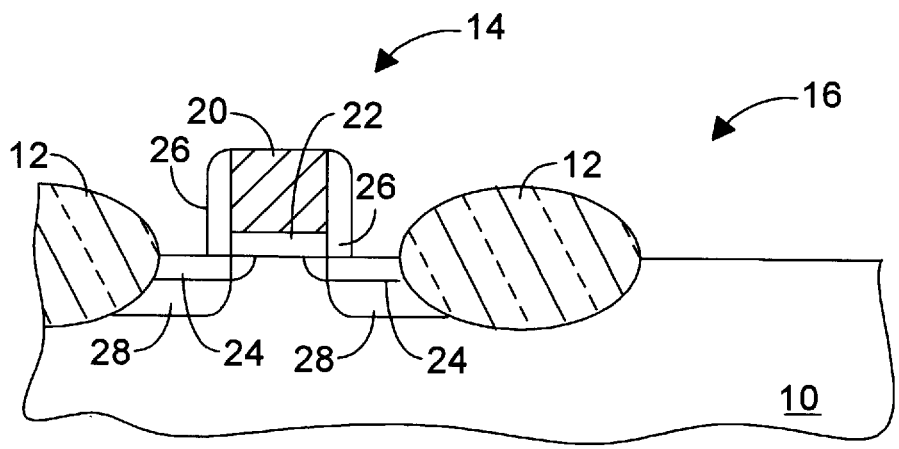
FIG. 2 is a partial cross-sectional view of the semiconductor substrate having a first transistor formed upon a first elevation level according to a processing step subsequent to FIG. 1.

FIG. 2 depicts locally grown oxide formed as an isolation structure 12. The isolation structure 12 serves to isolate active and passive devices from one another. In the instance shown, isolation structure 12 isolates first transistor 14 from other devices placeable in region 16. Accordingly, the topography shown in FIG. 2 includes isolation structures interspersed between active areas upon which and into which features of various devices are placed.

First transistor 14 includes, according to one embodiment, a gate conductor 20 configured upon a gate dielectric 22.

Gate conductor 20 as well as isolation structures 12 serves to mask implant of a lightly doped drain ("LDD") 24 into the regions therebetween. Thereafter, a CVD oxide is deposited across the topography and the oxide is then removed using an anisotropic etch. Resulting from the anisotropic etch, oxide spacers 26 are left on opposing sidewall surfaces of conductor 20. Spacers 26, as well as isolation structures 12, serve then to mask implant of source/drain impurities 28. The source/drain implant 28, in conjunction with LDD implant 24, comprise a junction wherein the term "junction" connotates either a source region or a drain region. It is the junction which serves to receive various silicides and metal conductors (not shown). The silicides help reduce contact resistivity, and the metal conductors allow connection of one device to another device to complete the integrated circuit.

Figure 3:
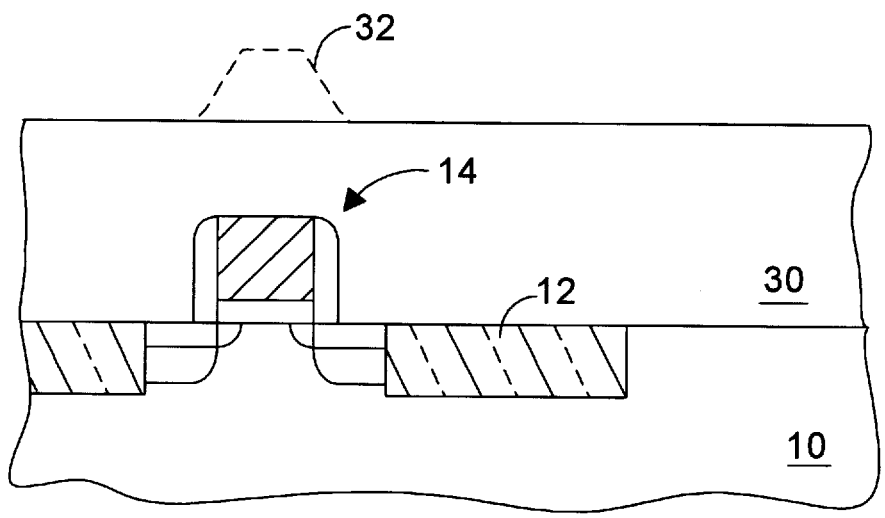
FIG. 3 is a partial cross-sectional view of the semiconductor substrate having an interlevel dielectric placed over the first transistor according to a processing step subsequent to FIG. 2.

Referring to FIG. 3, a processing step subsequent to FIG. 2 is shown. In particular, FIG. 3 illustrates an interlevel dielectric deposited across the first topography onto which, and into which, first transistor 14 and isolation structures 12 reside. Isolation structure 12 shown in FIG. 3 depicts a shallow trench isolation structure similar to FIG. 1, rather than the alternative isolation LOCOS which can be used and is illustrated for exemplary purposes in FIG. 2. Interlevel dielectric 30 can be deposited in numerous ways. Preferably, dielectric 30 is deposited as an oxide using CVD techniques. According to one embodiment, dielectric 30 is deposited using plasma enhanced CVD to a thickness sufficient to isolate transistor 14 from devices subsequently placed upon and within dielectric 30 upper surface. In preparation for those subsequent devices, dieletric 30 is preferably planarized after it is deposited. According to one embodiment, peak elevation regions 32 of dielectric 30 are removed by chemical mechanical polishing ("CMP"). CMP utilizes a slurry material and a polishing pad placed on the exposed surface, whereby the pad rotates and removes the upper surfaces commensurate with the lower surfaces. According to another embodiment, the upper surfaces 32 are removed using a sacrificial etch back. In this instance, a sacrificial material is placed on the upper surface such that the recesses or valleys are filled with that material. The material upper surface is then removed at an etch rate substantially the same as the dielectric underlayer. When all of the sacrificial material is removed, the remaining dielectric surface is approximately planar in that it takes on the same contours as the planar surface of the sacrificial material.

Figure 4:
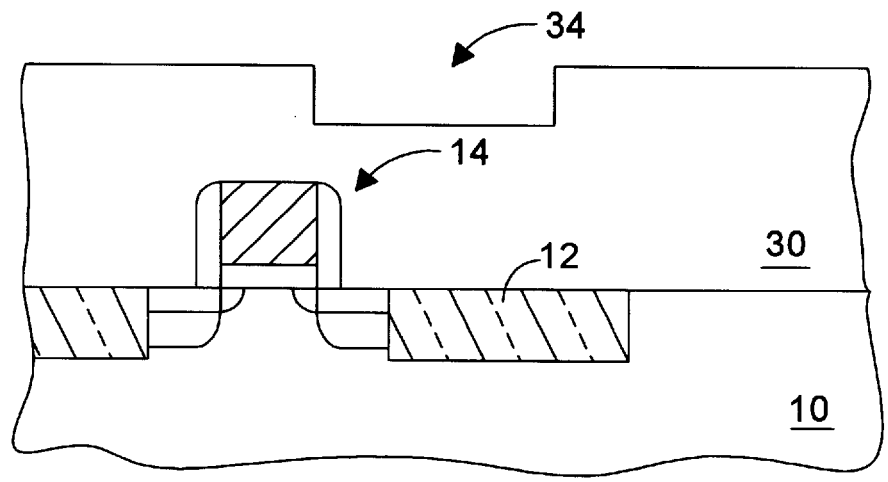
FIG. 4 is a partial cross-sectional view of the semiconductor substrate having a trench formed within the upper surface of the interlevel dielectric according to a processing step subsequent to FIG. 3.

Referring to FIG. 4, a processing step subsequent to FIG. 3 is shown. FIG. 4 depicts a trench 34 formed within the upper surface of dieletric 30. Trench 34 is produced by placing a masking layer across dielectric 30 and then patterning the masking layer such that the region to be trenched is exposed. The exposed region is then subjected to an etchant which, according to one embodiment, is a dry (anisotropic) etchant.

Figure 5:
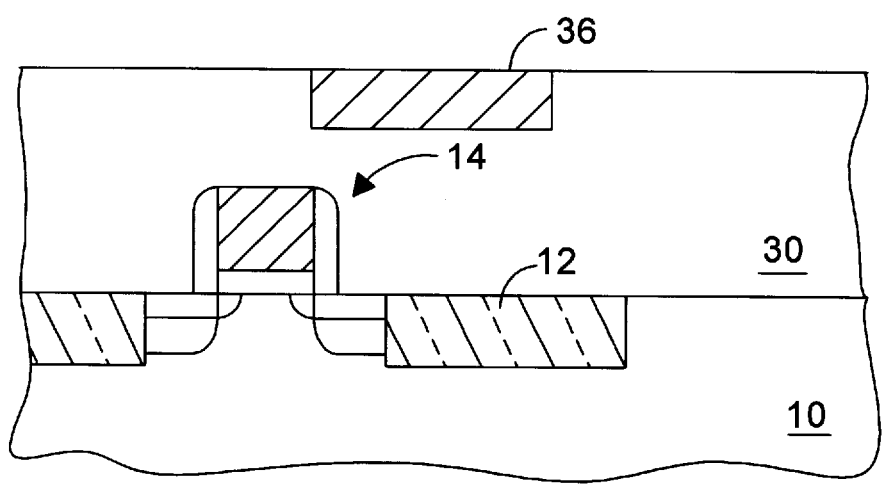
FIG. 5 is a partial cross-sectional view of the semiconductor substrate having polysilicon formed within the trench according to a processing step subsequent to FIG. 4.

As shown in FIG. 5, trench 34 is filled with a polycrystalline ("polysilicon") material 36. Polysilicon 36 fills trench 34 by blanket depositing a layer of polysilicon to a thickness which is greater than the depth of trench 34. Thereafter, the upper regions of the polysilicon layer are removed using, for example, chemical mechanical polish ("CMP"). Removal continues for a time sufficient to retain polysilicon 36 only within the confines of trench 34.

Figure 6:
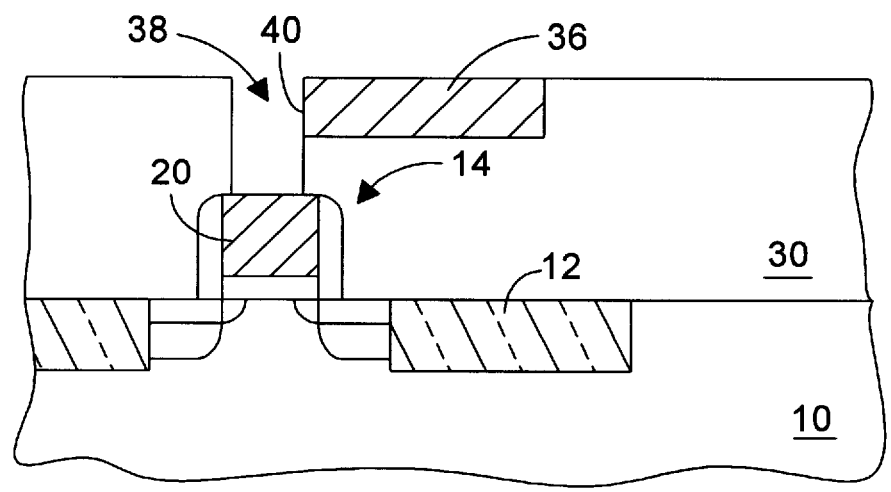
FIG. 6 is a partial cross-sectional view of the semiconductor substrate having an opening formed through the interlevel dielectric according to a processing step subsequent to FIG. 5.

FIG. 6 illustrates a processing step subsequent to FIG. 5 wherein an opening is formed through dielectric 30 to gate conductor 20 of transistor 14. The opening is designated as reference numeral 38, and is depicted as being aligned with and immediately adjacent to polysilicon 36. As a result of opening 38, polysilicon 36 is exposed at one edge, henceforth designated as the drain-side 40, of polysilicon 36. Opening 38 is created by various etch techniques, with non-etched areas protected by a masking layer, such as photoresist. Those etch techniques include, but are not limited to, plasma or wet etch.

Figure 7:
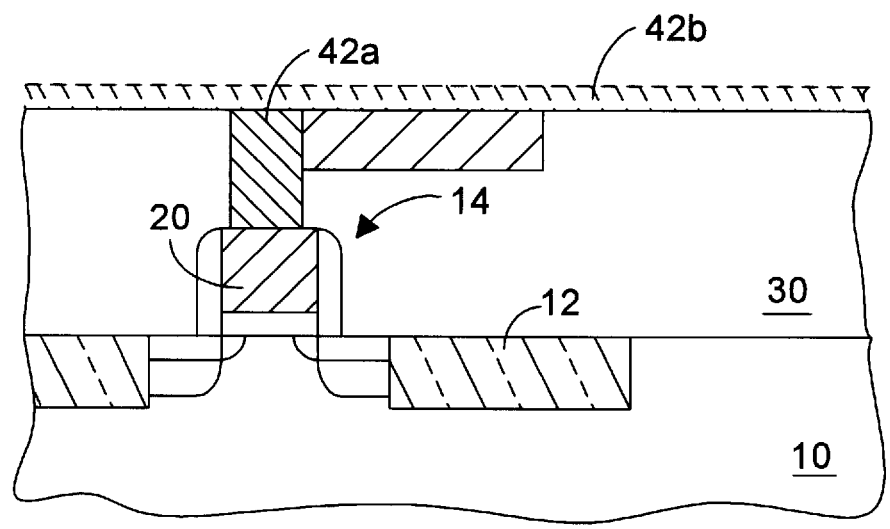
FIG. 7 is a partial cross-sectional view of the semiconductor substrate having metal formed within the opening to form a metal via according to a processing step subsequent to FIG. 6.

Referring to FIG. 7, a processing step subsequent to FIG. 6 is shown, whereby a metal material is deposited across the entire topography of dielectric 30 as well as polysilicon 36 and opening 38. The metal is deposited in various ways such as, for example, sputter deposition, evaporation, etc. Regardless of the deposition method chosen, metal 42 fills opening 38 such that a via 42a occurs. Metal outside opening 38 is denoted as metal 42b. Metal 42b is removed is removed by a subsequent etch or polish step. According to one embodiment, metal via 42a comprises Ti, TiN, W or Al. Metal via 42a extends from the drain-side 40 polysilicon 36 to gate conductor 20 of first transistor 14. The via structure thereby serves to electrically connect the drain-side 40 to gate conductor 20 for the benefit shown in FIG. 8.

Figure 8:
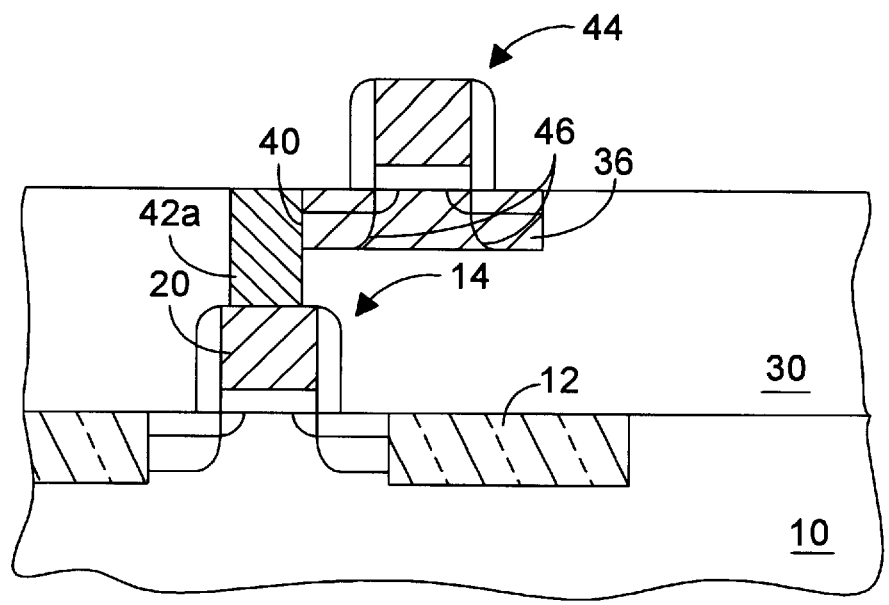
FIG. 8 is a partial cross-sectional view of the semiconductor substrate having a second transistor formed upon and within the polysilicon (i.e., along a second elevation level) according to a processing step subsequent to FIG. 7.

FIG. 8 depicts a processing step subsequent to FIG. 7, wherein a second level transistor 44 is formed upon and within polysilicon 36. Second level transistor 44, henceforth referred to as second transistor 44, comprises essentially the same features as first transistor 14. Those features are confined entirely within polysilicon 36. Preferably, the source/drain junction region 46 of second transistor 44 extends downward to the bottom surface of polysilicon 36, or lower. Metal in via 42a makes contact between drain 46 and polysilicon gate 20 and, therefore, it is necessary to ensure that no electrical contact is made to the well, or channel region between source/drain areas 46. If contact is made, the top of transistor 44 will short out. Therefore, by making junctions 46 to extend to the bottom of polysilicon substrate 36, vertical metal interconnect makes electrical contact only to the drain region edge 40, and not to the well or channel area. For sake of clarity, polysilicon 36, as well as source/drain junction implant regions 46, are not drawn to scale. The topological thickness and area of polysilicon 36 can be adjusted depending upon the size of transistor 44 as well as the implant depth of source/drain junction 46. It is not imperative that the relative features be drawn to scale or that dimensions be specified, all of which would be readily apparent to those skilled in the art given the benefits described herein. All that is necessary, however, is that the drain-side 40 of polysilicon 36 abut against the upper, lateral surface of via 42a such that electrical connection is made in the shortest possible manner from the drain implant 46 to via 42a and eventually to gate conductor 20.

Second transistor 44 and, more particularly, drain-side edge 40, is aligned such it resides directly over, and slightly off center of, gate conductor 20. The benefit in this alignment is to allow direct routing of via 42a therebetween. Via 42a therefore extends along a vertical axis (i.e., along an axis perpendicular to the substantially planar topography upon which first transistor 14 is formed and perpendicular to the substantially planar topography on which second transistor 44 is formed). Polysilicon 36 thereby suffices as a substrate or well into which various dopants can be introduced to render that substrate or well semiconductive. Polysilicon 36 is therefor used as the region into which all source/drain and threshold adjust implants are introduced similar to those used in the first transistor 14 except that the edges of polysilicon 36 define the edges of the source/drain and LDD implants.

Figure 9:
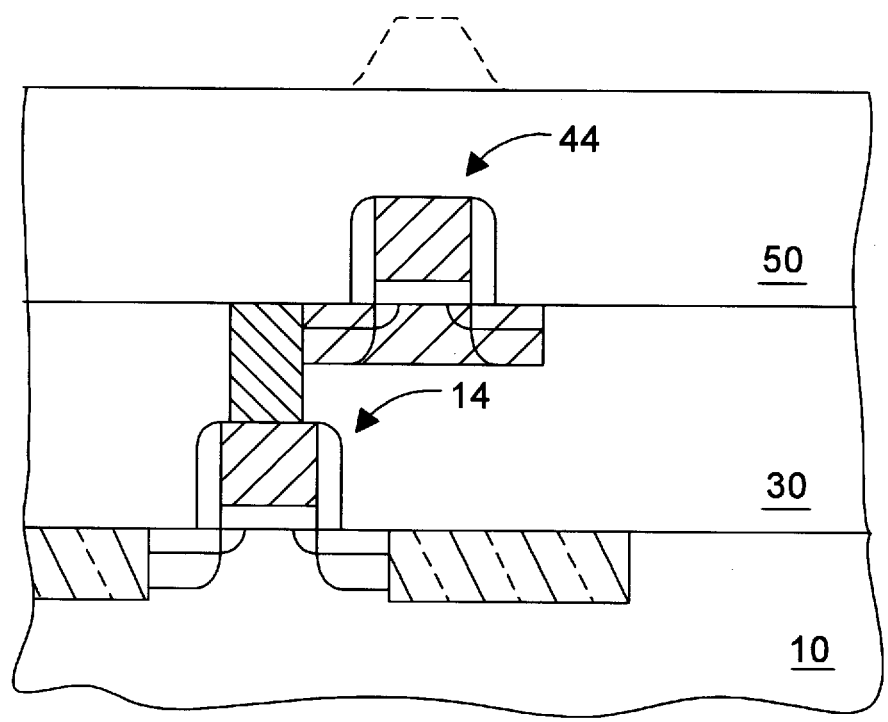
FIG. 9 is a partial cross-sectional view of the semiconductor substrate having another interlevel dielectric placed on the second transistor in readiness for yet another level of transistors according to a processing step subsequent to FIG. 8.

FIG. 9 illustrates a processing step subsequent to FIG. 8 whereby another interlevel dielectric 50 can be fashioned upon second transistor 44 and the lateral topography into which and upon which transistor 44 occurs. Dielectric 50 can be planarized, similar to that used to planarize dielectric 30. Accordingly, dielectric 50 affords an opportunity to introduce a polysilicon on its upper surface and a third level transistor which can, if needed, be connected to either the second level transistor 44 and/or the first level transistor 14. Depending upon the number of levels needed, numerous other transistors can be stacked almost endlessly into a third dimension to allow multi-level device fabrication hereof.

It will be appreciated to those skilled in the art having the benefit of this disclosure that the present process methodology is capable of producing p-type and/or n-type devices in three dimensions. Furthermore, it is also to be understood that the form of the invention shown and described is to be taken as exemplary, presently preferred embodiments. Various modifications and changes may be made to each and every processing step without departing from the spirit and scope of the invention provided the interconnect concepts set forth in the claims are retained. It is intended that the following claims be interpreted to embrace all such modifications and changes, and accordingly, the specification and drawings are to be regarded in an illustrative rather than a restrictive sense.

What is claimed is:

1. A method for interconnecting a gate of a first transistor to a drain of a second transistor, comprising:

providing a first transistor comprising a gate conductor formed upon a first topography;

depositing a dielectric across said gate conductor and said first topography;

forming a trench within said layer of dielectric and filling said trench with a polysilicon;

etching an opening through said dielectric to said gate conductor;

filling said opening with a metal, wherein said metal contacts a drain side of said polysilicon; and implanting dopants within said drain side of said polysilicon to form a drain region of a second transistor.

2. The method as recited in claim 1, wherein said etching the opening comprises removing an area immediately adjacent the drain side of said polysilicon.

3. The method as recited in claim 1, wherein said gate conductor is dielectrically spaced upon said first topography.

4. The method as recited in claim 1, wherein said dielectric comprises oxide.

5. The method as recited in claim 1, wherein said forming the trench comprises removing a portion of said dielectric to an elevation spaced a distance above said gate conductor.

6. The method as recited in claim 1, wherein said filling the trench comprises:

depositing polysilicon within said trench to a thickness which exceeds the depth of said trench; and removing said polysilicon to an elevation commensurate with an upper surface of said dielectric.

7. The method as recited in claim 1, wherein said metal is selected from the group consisting of Ti, W, TiN and Al.

8. The method as recited in claim 1, wherein said first and second transistors are vertically spaced from one another on separate elevational levels.

9. A method for interconnecting a pair of transistors, comprising:

providing a first transistor comprising a gate conductor formed upon a first topography;

forming, across said gate conductor and said first topography, a dielectric having a substantially planar dielectric surface;

removing a region of said dielectric surface a pre-defined distance into said dielectric to form a trench;

filling said trench with a polysilicon material;

etching an opening immediately adjacent said polysilicon from said dielectric surface to said gate conductor;

filling said opening with a metal material; and forming a source region and a drain region spaced apart from each other and laterally bounded within said polysilicon to form a second transistor, wherein the boundary of said drain region abuts against said metal to form an interconnection to said gate conductor, and wherein the boundary of said drain region further extends to the bottom surface of said polysilicon.

10. The method as recited in claim 9, wherein said removing comprises etching a pattern bounded on one side by a vertical axis extending directly upward from said gate conductor.

11. The method as recited in claim 9, wherein said removing and said filling comprising forming a metal via which extends along an axis perpendicular to said dielectric surface.

12. The method as recited in claim 11, wherein said metal via comprises an upper portion and a lower portion opposite the upper portion, said upper portion comprises a lateral surface proximate thereto which abuts against said drain region and said lower portion comprises a bottom surface which abuts against said gate conductor.

13. The method as recited in claim 9, wherein said gate conductor is dielectrically spaced upon said first topography.

14. The method as recited in claim 9, wherein said dielectric comprises oxide.

15. The method as recited in claim 9, wherein said forming the trench comprises removing a portion of said dielectric to an elevation spaced a distance above said gate conductor.

16. The method as recited in claim 9, wherein said filling the trench comprises:

depositing polysilicon within said trench to a thickness which exceeds the depth of said trench; and removing said polysilicon to an elevation commensurate with an upper surface of said dielectric.

17. The method as recited in claim 9, wherein said metal is selected from the group consisting of Ti, W, TiN and Al.

18. The method as recited in claim 9, wherein said first and second transistors are vertically spaced from one another on separate elevational levels.

* * * * *